(12) United States Patent
Imgrüt et al.

(10) Patent No.: US 10,749,307 B2
(45) Date of Patent: Aug. 18, 2020

(54) ADAPTER PLATE ALIGNMENT GAUGE SYSTEM AND METHOD FOR ALIGNING A CRIMPING TOOL FOR A CRIMPING PRESS

(71) Applicant: Komax Holding AG, Dierikon (CH)

(72) Inventors: Peter Imgrüt, Cham (CH); Beat Wicki, Adligenswil (CH)

(73) Assignee: KOMAX HOLDING AG, Dierikon (CH)

( * ) Notice: Subject to any disclaimer, the term of this patent is extended or adjusted under 35 U.S.C. 154(b) by 301 days.

(21) Appl. No.: 15/596,130

(22) Filed: May 16, 2017

(65) Prior Publication Data

US 2017/0338615 A1    Nov. 23, 2017

(30) Foreign Application Priority Data

May 18, 2016   (EP) ..................... 16170183

(51) Int. Cl.
*H01R 43/048* (2006.01)
*B21D 37/04* (2006.01)
*F16B 2/06* (2006.01)
*H01R 43/055* (2006.01)
*H05K 13/00* (2006.01)

(52) U.S. Cl.
CPC .......... *H01R 43/048* (2013.01); *B21D 37/04* (2013.01); *F16B 2/06* (2013.01); *H01R 43/055* (2013.01); *H05K 13/00* (2013.01)

(58) Field of Classification Search
CPC ......... H01R 43/048; B21D 37/04; F16B 2/06; H05K 13/00

USPC ............... 29/271, 753, 712, 761, 33 M, 863; 72/441
See application file for complete search history.

(56) References Cited

U.S. PATENT DOCUMENTS

| 5,618,932 | A | 4/1997 | Zampini et al. |
| 7,562,441 | B2 * | 7/2009 | Conte ................. H01R 43/048 29/33 M |
| 2010/0071203 | A1 * | 3/2010 | Blickenstorfer ..... H01R 43/048 29/753 |
| 2015/0162717 | A1 | 6/2015 | Particka et al. |

FOREIGN PATENT DOCUMENTS

| CN | 101595608 A | 12/2009 |
| DE | 202006020927 U1 | 1/2011 |
| EP | 1341269 A1 | 9/2003 |
| EP | 2738886 A1 | 6/2014 |

* cited by examiner

*Primary Examiner* — Monica S Carter
*Assistant Examiner* — Katina N. Henson
(74) *Attorney, Agent, or Firm* — William J. Clemens; Shumaker, Loop & Kendrick, LLP

(57) ABSTRACT

An adapter plate alignment gauge system includes an adapter plate for holding a crimping tool in different positions and an alignment gauge for aligning the crimping tool in a predetermined set crimping tool position relative to the alignment gauge. The adapter plate is immovably arrangeable in a predetermined set adapter plate position in a crimping press which, in order to create a crimp connection, connects one conductor end of a cable to a crimp contact. The alignment gauge can be fastened to the adapter plate whereby the alignment gauge is arranged in a predetermined set alignment gauge position relative to the adapter plate.

8 Claims, 6 Drawing Sheets

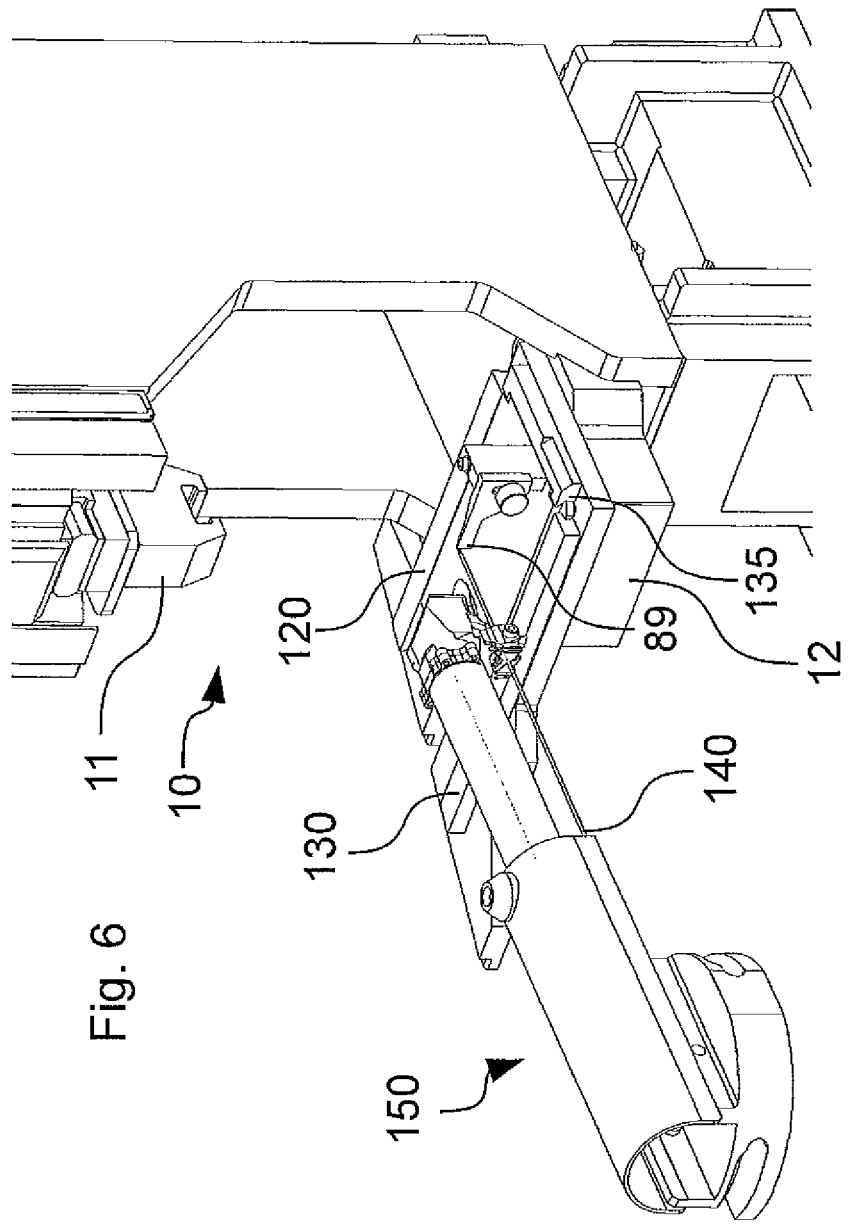

ADAPTER PLATE ALIGNMENT GAUGE SYSTEM AND METHOD FOR ALIGNING A CRIMPING TOOL FOR A CRIMPING PRESS

FIELD

The invention relates to an adapter plate alignment gauge system and to a method for aligning a crimping tool for a crimping press.

BACKGROUND

It is important for the quality of a crimp connection that the cable tip be aligned precisely relative to the crimp contact during the crimping process or crimping procedure. In this regard, it is primarily the position of the cable tip in the longitudinal direction that is important, with a tolerance of the so-called insertion depth of 0.1 mm or less being demanded in some cases. Conventionally, the crimping tool is inserted by hand, but the position is generally not identical after each tool change, since the tool holder does not reproducibly fix the crimping tool in the same position. As a result, in crimp connection with a small tolerance for the insertion depth, the cable tip must generally be realigned after every tool change.

After a crimping tool that is installed in a crimping press is changed for another crimping tool, the cable or cable tip must typically be realigned again relative to the crimping tool. As a rule, this leads to longer interruptions of the operation of the crimping press. This results in elevated costs.

SUMMARY

One object on which the present invention is based is therefore to provide a system and a method by means of which a crimping tool can be arranged such that, after the installation of the crimping tool in the crimping press, no alignment of the cable or cable tip in relation to the crimping tool is necessary.

In particular, the object is achieved by an adapter plate alignment gauge system comprising an adapter plate for holding a crimping tool in different positions and an alignment gauge for aligning the crimping tool in a predetermined set crimping tool position relative to the alignment gauge, with the adapter plate being immovably arrangeable in a predetermined set adapter plate position in a crimping press which, in order to create a crimp connection, connects one conductor end of a cable to a crimp contact, with the alignment gauge and the adapter plate being embodied such that the alignment gauge can be fastened to the adapter plate in such a way that the alignment gauge is arranged in a predetermined set alignment gauge position relative to the adapter plate.

One advantage of this is that the crimping tool can usually be fastened to the adapter plate also or even already outside of the crimping press such that, after the installation of the adapter plate with the crimping tool in the crimping press, the crimping tool is always arranged in the same position relative to the crimping press and hence relative to the cable. As a result of this, a realignment or repositioning of the cable or of the conductor end of the cable in relation to the crimping tool after the crimping tool is changed is typically not necessary. This saves time and reduces costs. In addition, crimping tools that are used and installed in different crimping presses, can generally always be immovably arranged or fixed in the same position relative to the crimping press and/or to the conductor end of the cable or crimp contact. A realignment or repositioning of the cable or conductor end of the cable after the insertion of the crimping tool into different crimping presses is therefore typically not necessary.

In one embodiment, at least a portion of the alignment gauge is designed so as to be height-adjustable and lockable at different distances to the adapter plate. This enables a finger or projection of the alignment gauge, for example, to be typically first left in an upper height position while the crimping tool is roughly positioned in the crimping tool position and to then be moved into a lower height position only when the crimping tool has been positioned roughly in the correct position. The crimping tool can then usually be positioned precisely in the crimping tool position. This typically reduces the time required for the aligning of the crimping tool on the adapter plate.

The adapter plate can be designed to receive the crimping tool, and the crimping tool can be detachably and immovably fastenable to the adapter plate in several different positions, particularly steplessly. In this way, it is ensured that the crimping tool can be typically arranged and fastened in a technically simple and precise manner in the crimping tool position. Stepless means that the various positions of the crimping tool are distributed continuously over the adapter plate; that is, the crimping tool is not displaceable in fixed increments and fastenable only in certain positions on the adapter plate, but rather the crimping tool can be displaced freely in increments of any size and fastened in any position on the adapter plate after the crimping tool is displaced relative to the adapter plate.

In another embodiment, the adapter plate has an adapter plate frame and a receiving plate, with the receiving plate being displaceable relative to the adapter plate frame and the receiving plate being immovably fastenable in different positions on the adapter plate frame, and with the receiving plate being embodied such that the crimping tool can be fastened to the receiving plate in a detachable and immovable manner. This enables the crimping tool to be fastened in a technically simple manner to the adapter plate.

In another embodiment, the adapter plate alignment gauge system further comprises a base plate, with the alignment gauge and the base plate being embodied such that the alignment gauge can be fastened in the alignment gauge position on the base plate, and with the base plate being fastenable in an immovable and detachable manner in the predefined alignment gauge position on the crimping press such that the alignment gauge is located in a position relative to the crimping press that corresponds to the position of the alignment gauge when the alignment gauge is fastened in the alignment gauge position on the adapter plate and the adapter plate is immovably arranged in the adapter plate position in the crimping press. As a result, it is possible to use a base plate that can be manufactured in a technically simpler and more cost-effective manner than the adapter plate in order to position the cable relative to the crimping press and the crimp contacts such that the conductor end of the cable is aligned in relation to the crimping tool, which, in turn, is aligned relative to the alignment gauge. If the cable on whose conductor end the crimp contact is to be mounted is aligned with the alignment gauge fastened to the base plate and the crimping tool is aligned with the alignment gauge fastened to the adapter plate, the crimping tool is typically aligned with the conductor end of the cable after the installation of the adapter plate with the crimping tool in the crimping press, so that the crimping procedure can be readily carried out and the crimping press operated after the installation of the adapter plate with the crimping tool in the crimping press.

The alignment gauge can have a tapering projection. One advantage of this is that the crimping tool can generally be aligned even more precisely in the crimping tool position.

In particular, the object is also achieved by a method for aligning a crimping tool for a crimping press, which is designed to create a crimp connection by means of a crimping tool that connects a conductor end of a cable to a crimp contact, relative to an adapter plate, with the crimping tool being fastenable in a detachable and immovable manner to the adapter plate, and with the method comprising the following steps: fastening of the alignment gauge to the adapter plate such that the alignment gauge is arranged in a predetermined set alignment gauge position relative to the adapter plate, displacement of the crimping tool relative to the adapter plate until the crimping tool is located in a predetermined set crimping tool position relative to the alignment gauge, and fastening of the crimping tool to the adapter plate, so that the crimping tool is detachably fastened so as to be immovable relative to the adapter plate.

One advantage of this is that the crimping tool can typically also be fastened to the adapter plate outside of the crimping press such that, after the installation of the adapter plate with the crimping tool in the crimping press, the crimping tool is always arranged in the same position relative to the crimping press and/or to the conductor end of the cable and/or to the crimp contact. As a result, a realignment or repositioning of the crimping tool in relation to the crimping press and/or the cable and/or the crimp contact after the crimping tool is changed is typically not necessary. This saves time and reduces costs. In addition, crimping tools that are used in different crimping presses can generally always be arranged and/or fixed in the same position relative to the crimping press and/or to the crimp contact. A realignment or repositioning of the crimping tool after the installation thereof in different crimping presses is therefore typically not necessary.

The method can further comprise the step of the aligning of the conductor end of the cable relative to the alignment gauge, whereas the adapter plate is arranged with the alignment gauge in an immovable, detachable manner in the crimping press. One advantage of this is that it is typically ensured that the crimping tool is arranged in the process position during the arrangement in the crimping tool position in relation to the conductor end of the cable.

The step of the aligning of the cable relative to the alignment gauge can be carried out while the alignment gauge is fastened to the adapter plate without a crimping tool or to a base plate that is immovably arranged in the crimping press such that the alignment gauge is located in a position relative to the crimping press that corresponds to the position of the alignment gauge when the alignment gauge is fastened in the alignment gauge position to the adapter plate and the adapter plate is immovably arranged in the adapter plate position in the crimping press. It is possible to use a base plate that can be manufactured in a technically simpler and more cost-effective manner than the adapter plate in order to position the cable relative to the crimping press and the crimp contacts such that the conductor end of the cable is aligned in relation to the crimping tool, which, in turn, is aligned relative to the alignment gauge. This typically reduces costs and simplifies handling.

The displacement of the crimping tool relative to the adapter plate until the crimping tool is located in the defined crimping tool position relative to the alignment gauge can be performed by aligning the crimping tool roughly in the crimping tool position while a height-adjustable portion of the alignment gauge is located at a first distance to the adapter plate and the crimping tool is aligned precisely in the crimping tool position while the height-adjustable portion is located at a second distance to the adapter plate, with the second distance being shorter than the first distance. This generally reduces the time required for the aligning of the crimping tool on the adapter plate, since the position of the crimping tool is better visible during alignment.

Furthermore, the method can additionally comprise a step of the immovable fastening of the crimping tool to a receiving plate, with the adapter plate having an adapter plate frame and the receiving plate. In this step of the displacement of the crimping tool relative to the adapter plate frame until the crimping tool is located in the predetermined set crimping tool position relative to the alignment gauge, the crimping tool is displaced together with the receiving plate relative to the adapter plate frame, and in the step of the fastening of the crimping tool to the receiving plate, so that the crimping tool is detachably fastened so as to be immovable relative to the receiving plate, the receiving plate is fastened in a detachable and immovable manner to the adapter plate frame. This enables the crimping tool to be aligned in a technically simple manner.

It should be noted that several of the possible features and advantages of the invention are described herein with reference to different embodiments. A person skilled in the art understands that the features can be appropriately combined, adapted, or exchanged in order to arrive at additional embodiments of the invention.

DESCRIPTION OF THE DRAWINGS

Embodiments of the invention are described in the following with reference to the enclosed drawings, but neither the drawings nor the description are to be interpreted as restricting the invention.

FIG. 6 shows a perspective view of an adapter plate with alignment gauge, with the adapter plate being immovably arranged in a crimping press.

The figures are merely schematic and not true to scale. Same reference symbols in the figures designate features in the figures that are the same or have a similar effect.

DETAILED DESCRIPTION

Figure 1:
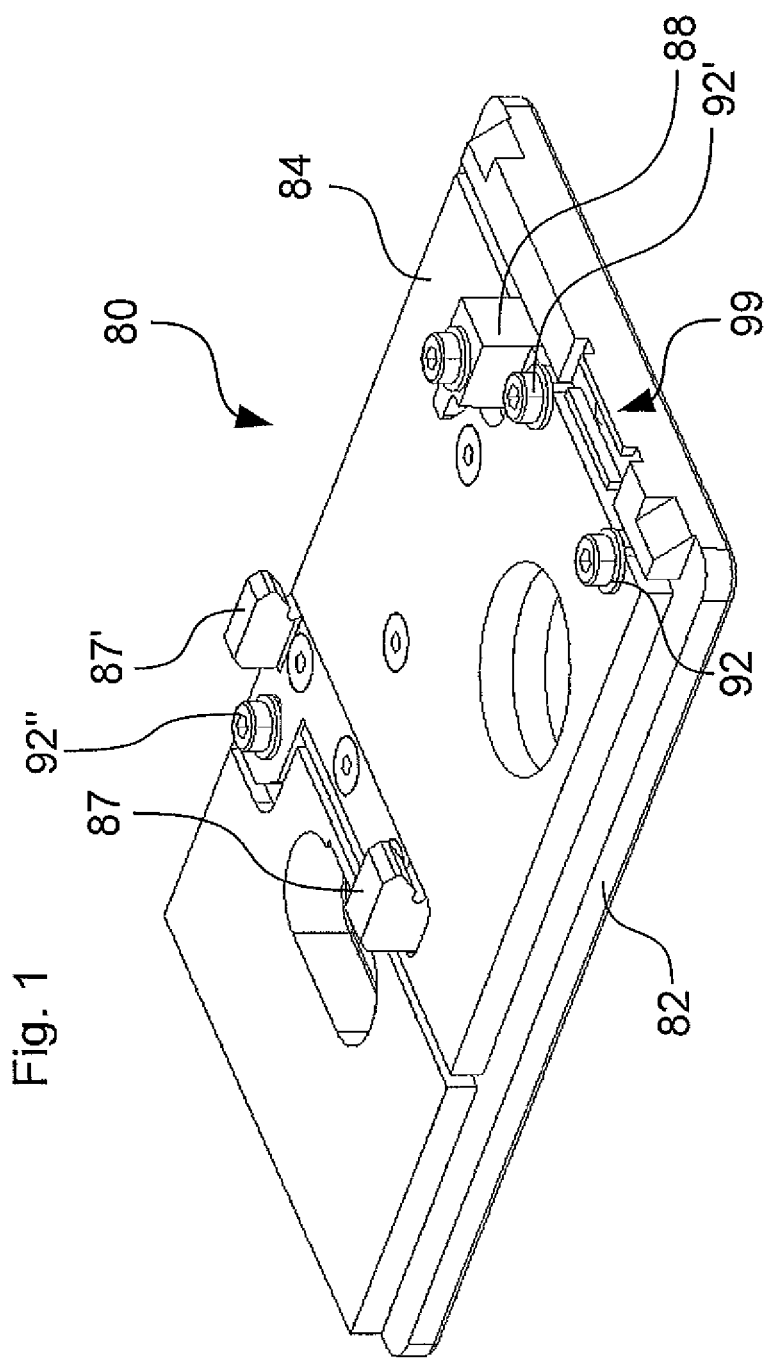
FIG. 1 shows a perspective view of a first inventive embodiment of an adapter plate of the adapter plate alignment gauge system.
Figure 2:
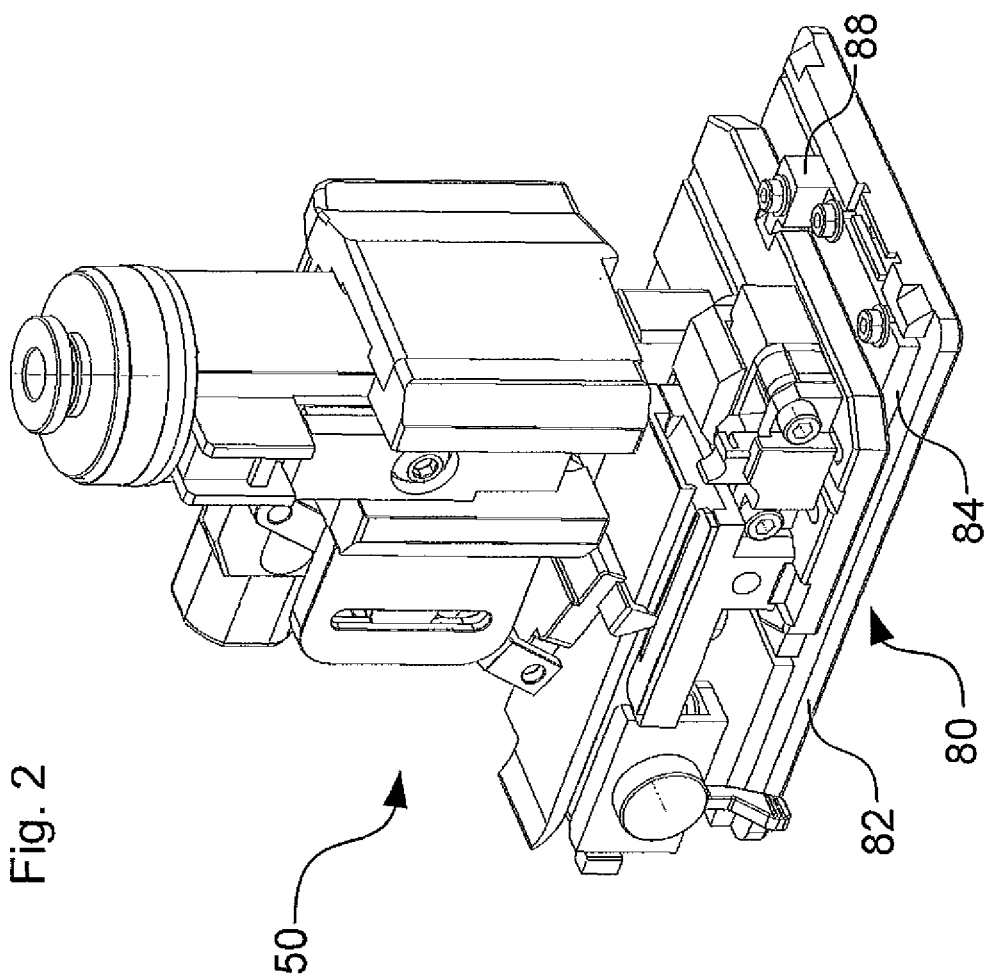
FIG. 2 shows a perspective view of the adapter plate from FIG. 1 with installed crimping tool.
Figure 3:
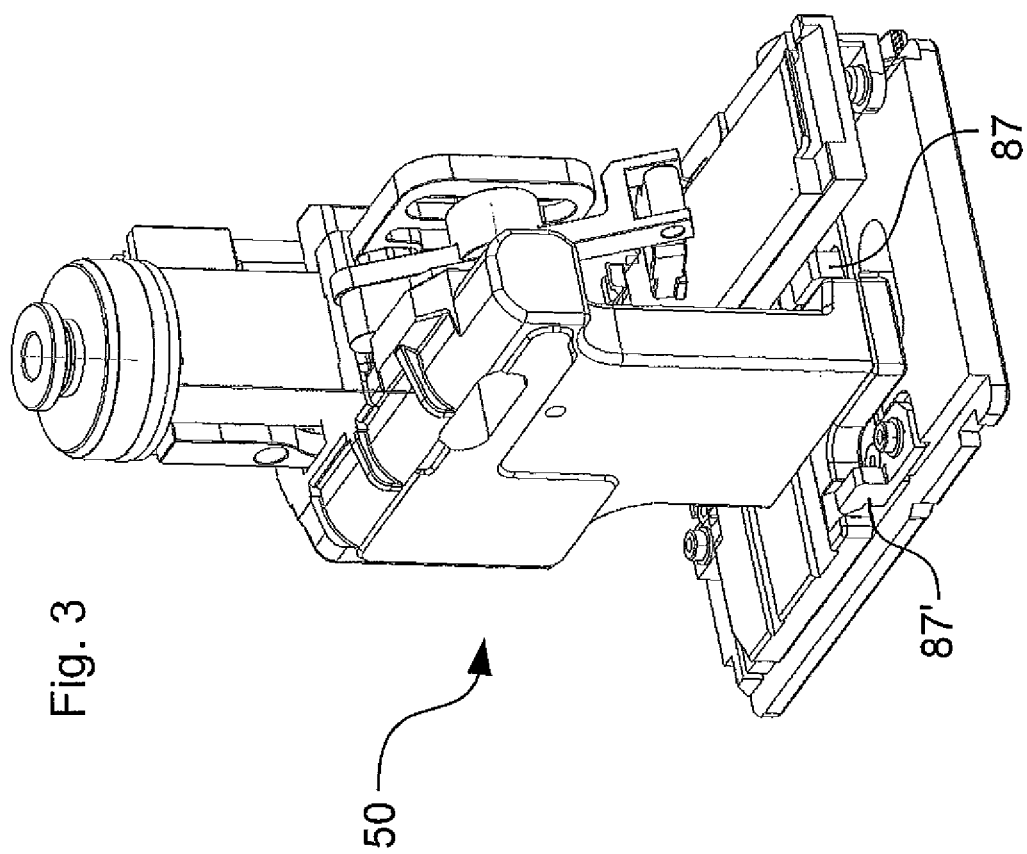
FIG. 3 shows an additional perspective view of the adapter plate from FIG. 1 with installed crimping tool.

FIG. 1 shows a perspective view of a first inventive embodiment of an adapter plate 80 of the adapter plate alignment gauge system. FIG. 2 shows a perspective view of the adapter plate 80 from FIG. 1 with installed crimping tool 50. FIG. 3 shows an additional perspective view of the adapter plate 80 from FIG. 1 with installed crimping tool 50.

Figure 4:
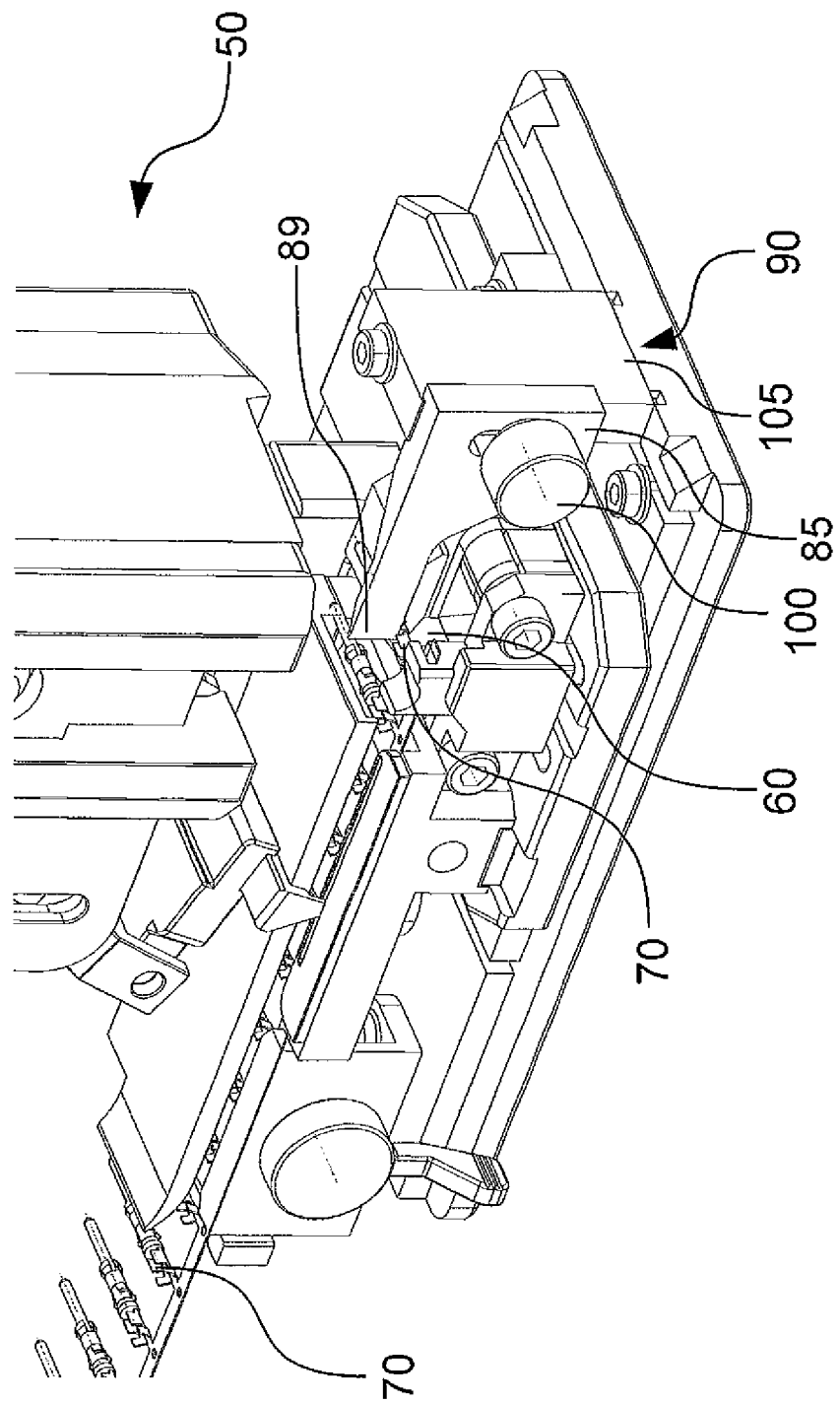
FIG. 4 shows a perspective view of the adapter plate alignment gauge system with installed crimping tool.
Figure 5:
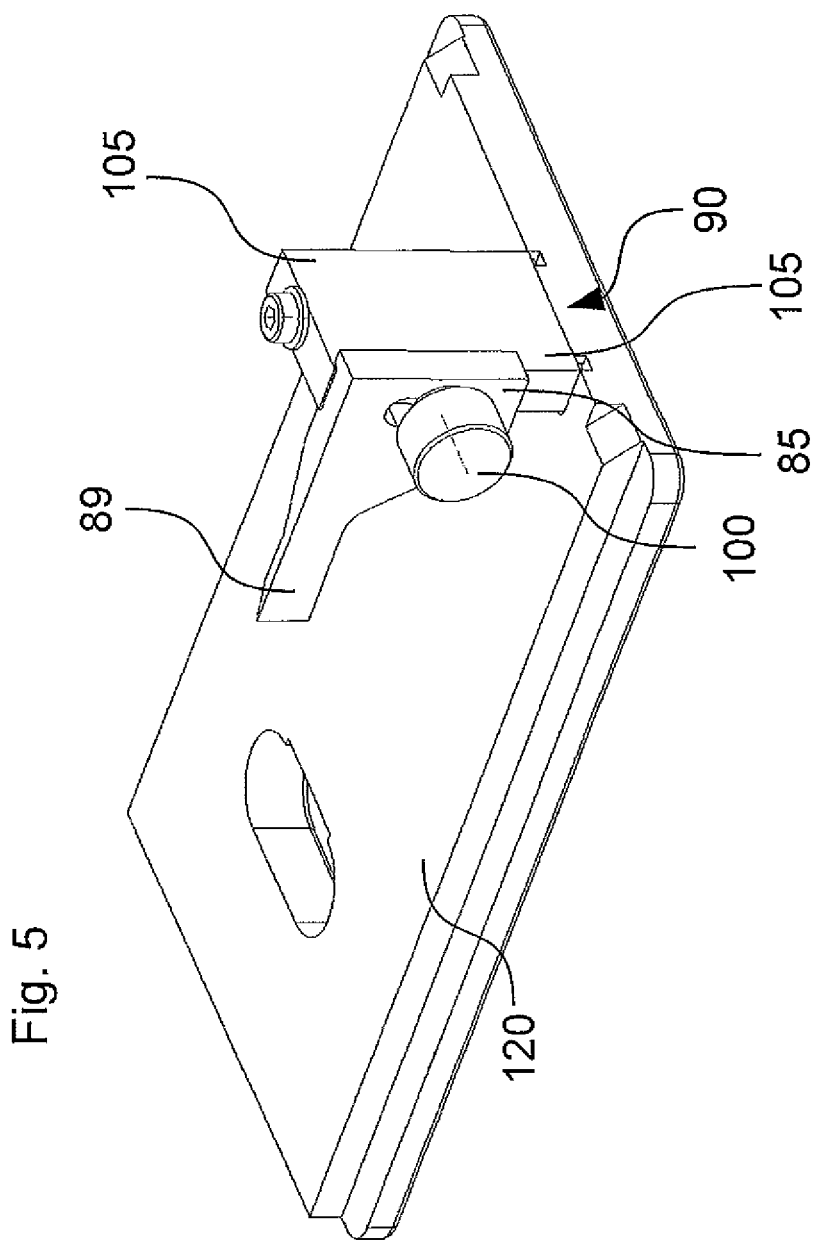
FIG. 5 shows a perspective view of a base plate with alignment gauge.

The adapter plate alignment gauge system comprises an adapter plate 80 and an alignment gauge 90 (see FIGS. 4 and 5). The adapter plate 80 has an adapter plate frame 82 and a receiving plate 84. The receiving plate 84 can be fixed or immovably fastened to the adapter plate frame 82. The receiving plate 84 has three catches 87, 87', 88. Two of the hook-shaped catches 87, 87' are rigidly fastened to the receiving plate 84. The third hook-shaped catch 88 can be arranged in a movable manner on the receiving plate 84. The three catches 87, 87', 88 serve the function of clamping the crimping tool 50 and fastening the crimping tool 50 to the receiving plate 84. The unit of receiving plate 84 and crimping tool 50 fastened thereto can be displaced relative to the adapter plate frame 82. The three screws 92, 92', 92", which are accessible even when the crimping tool 50 is set in place, are used to tighten and fix the receiving plate 84 on the adapter plate frame 82 after the crimping tool 50 (together with the receiving plate 84) has been aligned and positioned by means of the alignment gauge 90.

The receiving plate 84 can be fixed on or detachably and immovably fastened to the adapter plate 80 by means of the three screws 92, 92', 92". Detachably immovable means that no relative movement between adapter plate frame 82 and receiving plate 84 is possible in the fastened state, but the fastened state can be undone, thereby enabling a relative movement between adapter plate frame 82 and receiving plate 84.

The crimping tool 50 is immovably connected to the receiving plate 84, for example by means of a form fit. The adapter plate 80 can hold different crimping tools. Since the adapter plate 80 is always fixed or held or immovably arranged in the crimping press 10 or in different crimping presses in the same adapter plate position relative to the crimping press 10, the crimping tool 50 is always located in the same position relative to the crimping press 10 (when the adapter plate 80 is immovably arranged in the crimping press 10). Firmly or immovably arranged in the crimping press 10 means in particular that the crimping tool 50 is arranged so as to not be movable between (moving in the vertical direction) the upper tool holder 11 and the lower tool holder 12. The adapter plate 80 on which the crimping tool is immovably fastened can be fastened for this purpose directly or immediately to the crimping press 10, or the adapter plate 80 is fastened to or fixed on another device that is arranged so as to be immovable in relation to the crimping press 10.

Even after the crimping tool 50 is connected to the receiving plate 84, the three screws 92, 92', 92" are accessible for fastening the receiving plate 84 to the adapter plate frame 82.

The adapter plate position is a predetermined set position of the adapter plate 80 in relation to the crimping press 10. In the adapter plate position, the edge or edges of the adapter plate 80 has or have a defined spacing in relation to the upper tool holder 11 of the crimping press 10 and to the lower tool holder 12 of the crimping press 10, for example.

FIG. 4 shows a perspective view of the adapter plate alignment gauge system with installed crimping tool 50. The adapter plate 80 has an alignment gauge connecting device 99 (e.g., in the form of several recesses into which the alignment gauge 90 engages). The alignment gauge 90 is detachably fastened in a rigid, that is, immovable, manner by means of the alignment gauge connecting device 99 to the adapter plate 80 in the alignment gauge position. The alignment gauge position is clear; that is, when the alignment gauge 90 is fastened to the adapter plate 80, the alignment gauge 90 (particularly the alignment gauge holder 105 of the alignment gauge 90) is always located in the alignment gauge position. The finger 85 of the alignment gauge 90 is height-adjustable. Therefore, the position of the finger 85 is set only on a plane parallel to the upper surface of the adapter plate 80. The finger 85 is substantially plate-shaped, with the thickness and height of the finger 85 decreasing as the distance from the alignment gauge holder 105 increases.

The alignment gauge 90 comprises an alignment gauge holder 105 on which a finger 85 is arranged in the form of a tapering projection. The finger 85 is designed so as to be height-adjustable relative to the alignment gauge holder 105. The finger 85 can thus be arranged at different distances to the adapter plate 80. The alignment gauge 90 also comprises a knurled screw 100. Using the knurled screw 100, the finger 85 can be fixed and locked at different heights and different distances to the adapter plate 80 and then released.

The alignment gauge 90 can be fastened in exactly one position (namely the alignment gauge position) on the adapter plate 80 or on the adapter plate frame 82 of the adapter plate 80. The crimping tool 50 is aligned on the adapter plate 80 such that an edge 89 of the finger of the alignment gauge 90 is flush with an anvil 60 of the crimping tool 80 (e.g., with the center of the anvil 60). When the alignment gauge 90 (or a structurally identical alignment gauge) is fastened in the alignment gauge position on another adapter plate 80 that has the same construction as the adapter plate 80 shown in FIG. 4, the other crimping tool 50 can be positioned and fixed on this other adapter plate 80 in a crimping tool position relative to the finger 85 of the alignment gauge 90. As a result, the other crimping tool 50 is fixed in the same position in relation to the other adapter plate 80 as the crimping tool 50 shown in FIG. 4 in relation to the adapter plate 80 shown in FIG. 4. It is thus ensured that, when a first crimping tool 50 that is fixed on a first adapter plate 80 in a crimping tool position and arranged in a process position in a crimping press 10 is changed out for a second crimping tool 50 that is fixed on a second adapter plate 80 in a crimping tool position, the second crimping tool 50 is arranged precisely in the process position in the crimping press 10. In this way, it is achieved that the second crimping tool 50 need not be set up again or aligned in relation to the crimping press 10 or the cable 140 or vice versa (see also FIG. 6). This reduces the time during which the operation of the crimping press 10 is interrupted during the changing or exchanging of the crimping tool 50 for another crimping tool.

The crimping tool position is reached when a defined portion of the crimping tool 50 (e.g., the anvil 60, particularly the center of the anvil 60) is located beneath the finger 85 of the alignment gauge 90. When this condition is met, the crimping tool 50 is located in the crimping tool position relative to or in relation to the alignment gauge 90 and consequently relative to the adapter plate 80. It can also be expedient to determine the crimping tool position by aligning a crimp contact of the crimping tool 50 with the finger 85 of the alignment gauge 90. For example, the finger 85 of the alignment gauge 90 is to be at a predetermined distance (e.g., the projecting length of the cable over the crimp contact) from the end or one end of the crimp contact. This position or this point need not be the rear end of the anvil 60.

FIG. 5 shows a perspective view of a base plate 120 with alignment gauge 90.

The base plate 120 has the same outer dimensions as the adapter plate 80 and has a structurally identical alignment gauge connecting device 99. However, the base plate 120 is suitable for fixing a crimping tool 50 on the base plate 120. The base plate 120 is used to align the conductor end of the cable 140 in relation to or relative to the crimping press 10.

Since the base plate 120 has the same outer dimensions as the adapter plate 80 and the alignment gauge 90 is fastened in the same alignment gauge position on the base plate 120 as on the adapter plate 80, the alignment gauge 90 is located in the same position in relation to the crimping press 10 when the base plate 120 is arranged immovably in the crimping press 10 in the adapter plate position. The base plate 120 is used to set up the process position. In particular, the base plate 120 is used to set up and align the position of the conductor end of the cable 140.

FIG. 6 shows a perspective view of an adapter plate 80 with alignment gauge 90, with the adapter plate 80 being immovably arranged in a crimping press 10.

The adapter plate 80 is fixed by means of guide rails 130 of the crimping press 10, which engage over the adapter plate frame 82, and a stop member 135. The adapter plate 80 is pressed by an engaging member (not shown) against the stop member 135. The conductor end of the cable 140 that is to be connected to the crimp contact 70 is now aligned in relation to the alignment gauge 90. This means that the cable 140 is moved until the conductor end of the cable 140 is located at the edge 89 of the finger 85.

To set the process position, the crimping press 10 or cable processing machine has a program function that makes it possible to take a stripped cable 140 with the swivel unit 150 to the processing station, displace the cable tip by means of manual inputs in the direction of the cable and transversely thereto, and store the process position set in this way. This is substantially easier to achieve with the alignment gauge 90 than with a crimping tool 50, since the edge 89 of the finger 85 of the alignment gauge 90 has an ideal degree of visibility. The feature of the vertical or height-adjustability of the finger 85 is advantageous, since the cable 140 is lowered during crimping and consequently projects over the crimp contact 70 during setup.

If the process position is set with the aid of an alignment gauge that is geometrically identical or structurally identical to the alignment gauge 90 used to position the crimping tool 50 on the adapter plate 80, then it is ensured that the position of the cable tip is correct after any crimping tool is changed; that is, the conductor end of the cable 140 lies over the anvil 60, so that the crimping process can be carried out without further alignment.

It should be noted in conclusion that terms such as "having," "comprising," etc. do not exclude any other elements or steps, and terms such as "a" or "an" do not exclude a plurality. Reference symbols in the claims shall not be regarded as constituting limitations.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. An adapter plate alignment gauge system, comprising:
    an adapter plate for holding a crimping tool in different positions; and
    an alignment gauge, wherein the adapter plate is immovably arrangeable in a predetermined set adapter plate position in a crimping press, the crimping press, in order to create a crimp connection, connecting one conductor end of a cable to a crimp contact, wherein the alignment gauge is configured to be fastened to the adapter plate in a predetermined set alignment gauge position relative to the adapter plate, and wherein the alignment gauge includes a finger element which is height-adjustable and can be locked at different distances relative to the adapter plate, said finger element including a tip with an edge used to align the crimping tool in a predetermined set crimping tool position relative to the adapter plate.

2. The adapter plate alignment gauge system according to claim 1 wherein the adapter plate receives the crimping tool, and the crimping tool can be detachably and immovably fastened to the adapter plate in several different positions.

3. The adapter plate alignment gauge system according to claim 2 wherein the adapter plate is configured for fastening the crimping tool in the several different positions steplessly.

4. The adapter plate alignment gauge system according to claim 1 wherein the adapter plate includes an adapter plate frame and a receiving plate, the receiving plate being displaceable relative to the adapter plate frame and the receiving plate being immovably fastenable in different positions on the adapter plate frame, and wherein the receiving plate is configured for fastening the crimping tool thereto in a detachable and immovable manner.

5. The adapter plate alignment gauge system according to claim 1 further comprising a base plate, wherein the alignment gauge can be fastened in the alignment gauge position on the base plate, and the base plate being fastenable in an immovable and detachable manner in the predefined alignment gauge position on the crimping press such that the alignment gauge is located in a position relative to the crimping press that corresponds to a position of the alignment gauge when the alignment gauge is fastened in the alignment gauge position on the adapter plate and the adapter plate is immovably arranged in the adapter plate position in the crimping press.

6. The adapter plate alignment gauge system according to claim 1 wherein the finger element of the alignment gauge has a tapering projection.

7. An adapter plate alignment gauge system, comprising:
    an adapter plate for holding a crimping tool in different positions, wherein the adapter plate includes an adapter plate frame and a receiving plate, the receiving plate being displaceable relative to the adapter plate frame and the receiving plate being immovably fastenable in different positions on the adapter plate frame, and wherein the receiving plate is configured for fastening the crimping tool thereto in a detachable and immovable manner; and
    an alignment gauge, wherein the adapter plate is immovably arrangeable in a predetermined set adapter plate position in a crimping press, the crimping press, in order to create a crimp connection, connecting one conductor end of a cable to a crimp contact, wherein the alignment gauge is configured to be fastened to the adapter plate in a predetermined set alignment gauge position relative to the adapter plate, and wherein the alignment gauge includes a height-adjustable finger element including a tip with an edge used to align the crimping tool in a predetermined set crimping tool position relative to the adapter plate.

8. An adapter plate alignment gauge system, comprising:
    an adapter plate for holding a crimping tool in different positions;
    an alignment gauge, wherein the adapter plate is immovably arrangeable in a predetermined set adapter plate position in a crimping press, the crimping press, in order to create a crimp connection, connecting one conductor end of a cable to a crimp contact, wherein the alignment gauge is configured to be fastened to the adapter plate in a predetermined set alignment gauge position relative to the adapter plate, and wherein the alignment gauge includes a height-adjustable finger element including a tip with an edge used to align the crimping tool in a predetermined set crimping tool position relative to the adapter plate; and
a base plate, wherein the alignment gauge can be fastened in the alignment gauge position on the base plate, and the base plate being fastenable in an immovable and detachable manner in the predefined alignment gauge position on the crimping press such that the alignment gauge is located in a position relative to the crimping press that corresponds to a position of the alignment gauge when the alignment gauge is fastened in the alignment gauge position on the adapter plate and the adapter plate is immovably arranged in the adapter plate position in the crimping press.

* * * * *